US010569540B2

(12) United States Patent
Hirai et al.

(10) Patent No.: US 10,569,540 B2
(45) Date of Patent: Feb. 25, 2020

(54) LIQUID EJECTION HEAD, LIQUID EJECTING APPARATUS, AND PIEZOELECTRIC DEVICE

(71) Applicant: SEIKO EPSON CORPORATION, Tokyo (JP)

(72) Inventors: Eiju Hirai, Azumino (JP); Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/049,655

(22) Filed: Jul. 30, 2018

(65) Prior Publication Data

US 2019/0030891 A1 Jan. 31, 2019

(30) Foreign Application Priority Data

Jul. 31, 2017 (JP) ................................. 2017-148080
Jul. 31, 2017 (JP) ................................. 2017-148081

(51) Int. Cl.
*B41J 2/14* (2006.01)
*H01L 41/09* (2006.01)
*H01L 41/047* (2006.01)

(52) U.S. Cl.
CPC .. *B41J 2/14233* (2013.01); *B41J 2002/14491* (2013.01); *H01L 41/0475* (2013.01); *H01L 41/0973* (2013.01)

(58) Field of Classification Search
None
See application file for complete search history.

(56) References Cited

U.S. PATENT DOCUMENTS

| 2012/0069101 A1 | 3/2012 | Kato et al. |
| 2014/0176646 A1 | 6/2014 | Hirai et al. |
| 2017/0087839 A1* | 3/2017 | Tanaka ................. B41J 2/14201 |

FOREIGN PATENT DOCUMENTS

JP 2014-151623 A 8/2014

OTHER PUBLICATIONS

European Search Report issued in Application No. 18186126.1 dated Dec. 19, 2018.

* cited by examiner

*Primary Examiner* — Erica S Lin
(74) *Attorney, Agent, or Firm* — Workman Nydegger

(57) ABSTRACT

A liquid ejection head includes a chamber, and a piezoelectric device, wherein the piezoelectric device includes a first electrode, a piezoelectric layer, a second electrode, an insulating layer, a first wire electrically connected to the second electrode, and a second wire electrically connected to the second electrode, and the piezoelectric device has a first region in which the first electrode, the piezoelectric layer, and the second electrode are stacked, a second region which is located on a side adjacent to a first end of the piezoelectric layer and in which the first electrode, the piezoelectric layer, the insulating layer, and the first wire are stacked, and a third region which is located on a side adjacent to a second end of the piezoelectric layer opposite to the first end and in which the first electrode, the piezoelectric layer, the insulating layer, and the second wire are stacked.

18 Claims, 12 Drawing Sheets

LIQUID EJECTION HEAD, LIQUID EJECTING APPARATUS, AND PIEZOELECTRIC DEVICE

The entire disclosure of Japanese Patent Application No. 2017-148080, filed Jun. 31, 2017 and 2017-148081, filed Jun. 31, 2017 are expressly incorporated by reference herein.

BACKGROUND

1. Technical Field

The present invention relates to a structure of a piezoelectric device preferably adopted for, for example, a liquid ejection head.

2. Related Art

A liquid ejection head configured to vibrate a diaphragm constituting a wall surface of a pressure chamber by a piezoelectric element to eject liquid in the pressure chamber from a nozzle has been proposed. For example, JP-A-2014-151623 discloses a piezoelectric element having a laminated structure including a piezoelectric layer disposed between a first electrode and a second electrode. A drive signal is supplied to the second electrode formed on a surface of the piezoelectric element via a signal wire. The signal wire is formed adjacent to one end of the piezoelectric element which is long.

In the configuration disclosed in JP-A-2014-151623, however, sufficiently securing mechanical strength at an end of the piezoelectric element opposite to the signal wire is difficult. Moreover, in a configuration in which the wall surface of the pressure chamber is located outside a region in which the piezoelectric layer is formed, sufficiently securing mechanical strength at a region provided with no piezoelectric layer is difficult. Thus, cracks may be formed in the piezoelectric layer and/or the diaphragm.

SUMMARY

An advantage of some aspects of the invention is that formation of the cracks in a piezoelectric layer and/or a diaphragm is reduced.

A liquid ejection head according to a first aspect of the invention is a liquid ejection head including a pressure chamber in which liquid is stored and a piezoelectric device configured to cause the liquid to be ejected from the pressure chamber, wherein the piezoelectric device includes a first electrode, a piezoelectric layer, a second electrode, an insulating layer, a first wire electrically connected to the second electrode, and a second wire electrically connected to the second electrode, and the piezoelectric device has a first region in which the first electrode, the piezoelectric layer, and the second electrode are stacked in this order, a second region which is located on a side adjacent to a first end of the piezoelectric layer and in which the first electrode, the piezoelectric layer, the insulating layer, and the first wire are stacked in this order, and a third region which is located on a side adjacent to a second end of the piezoelectric layer opposite to the first end and in which the first electrode, the piezoelectric layer, the insulating layer, and the second wire are stacked in this order.

It is preferable that the first electrode includes a first portion in which the piezoelectric layer is stacked and a second portion different from the first portion, and the first wire establishes electric conduction with the second electrode on a surface of the piezoelectric layer and overlaps the second portion of the first electrode with the insulating layer disposed between the first wire and the second portion.

It is preferable that the first electrode includes a third portion located on a side of the first portion opposite to the second portion, and the second wire establishes electric conduction with the second electrode on the surface of the piezoelectric layer and overlaps the third portion of the first electrode with the insulating layer disposed between the second wire and the third portion.

It is preferable that the first wire establishes electric conduction with the second electrode on the surface of the piezoelectric layer via a first contact hole formed in the insulating layer, and the second wire establishes electric conduction with the second electrode on the surface of the piezoelectric layer via a second contact hole formed in the insulating layer.

It is preferable that the liquid ejection head includes a third wire which is disposed on a side of the second wire opposite to the first wire in plan view and which establishes electric conduction with the first electrode.

It is preferable that the first wire is supplied with a drive signal from an external circuit, and the second wire is electrically connected to the external circuit via the second electrode and the first wire.

It is preferable that the liquid ejection head further includes a diaphragm constituting a wall surface of the pressure chamber, and the liquid ejection head has a first laminate region in which the first electrode, the piezoelectric layer, and the second electrode are stacked in this order, and a second laminate region which is located on a side adjacent to the first end of the piezoelectric layer and in which the first electrode, the piezoelectric layer, the insulating layer, and the first wire are stacked in this order, and the pressure chamber has a first end at which the wall surface of the pressure chamber adjacent to the first end of the piezoelectric layer and the diaphragm intersect with each other, and the first end overlaps the second laminate region in plan view.

It is preferable that the second electrode is disposed on the surface of the piezoelectric layer, the first wire is disposed on a surface of the insulating layer and establishes electric conduction with the second electrode on the surface of the piezoelectric layer, the first end of the pressure chamber overlaps a region of the second laminate region in plan view, the region including the first electrode, the piezoelectric layer, the second electrode, the insulating layer, and the first wire which are stacked in this order.

It is preferable that the piezoelectric device includes the second wire electrically connected to the second electrode, and the piezoelectric device has a third laminate region which is located on a side adjacent to the second end of the piezoelectric layer opposite to the first end and in which the first electrode, the piezoelectric layer, the insulating layer, and the second wire are stacked in this order.

It is preferable that the pressure chamber has a second end at which a wall surface of the pressure chamber adjacent to the second end of the piezoelectric layer and the diaphragm intersect with each other, and the second end of the pressure chamber overlaps the third laminate region in plan view.

It is preferable that the second end of the pressure chamber overlaps a region of the third laminate region in plan view, the region including the first electrode, the piezoelectric layer, the second electrode, the insulating layer, and the second wire which are stacked in this order.

A liquid ejecting apparatus according to a second aspect of the invention includes the liquid ejection head described above.

A piezoelectric device according to a third aspect of the invention includes a first electrode, a piezoelectric layer, a second electrode, an insulating layer, a first wire electrically connected to the second electrode, and a second wire electrically connected to the second electrode, and the piezoelectric device has a first region in which the first electrode, the piezoelectric layer, and the second electrode are stacked in this order, a second region which is located on a side adjacent to a first end of the piezoelectric layer and in which the first electrode, the piezoelectric layer, the insulating layer, and the first wire are stacked in this order, and a third region which is located on a side adjacent to a second end of the piezoelectric layer opposite to the first end and in which the first electrode, the piezoelectric layer, the insulating layer, and the second wire are stacked in this order.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
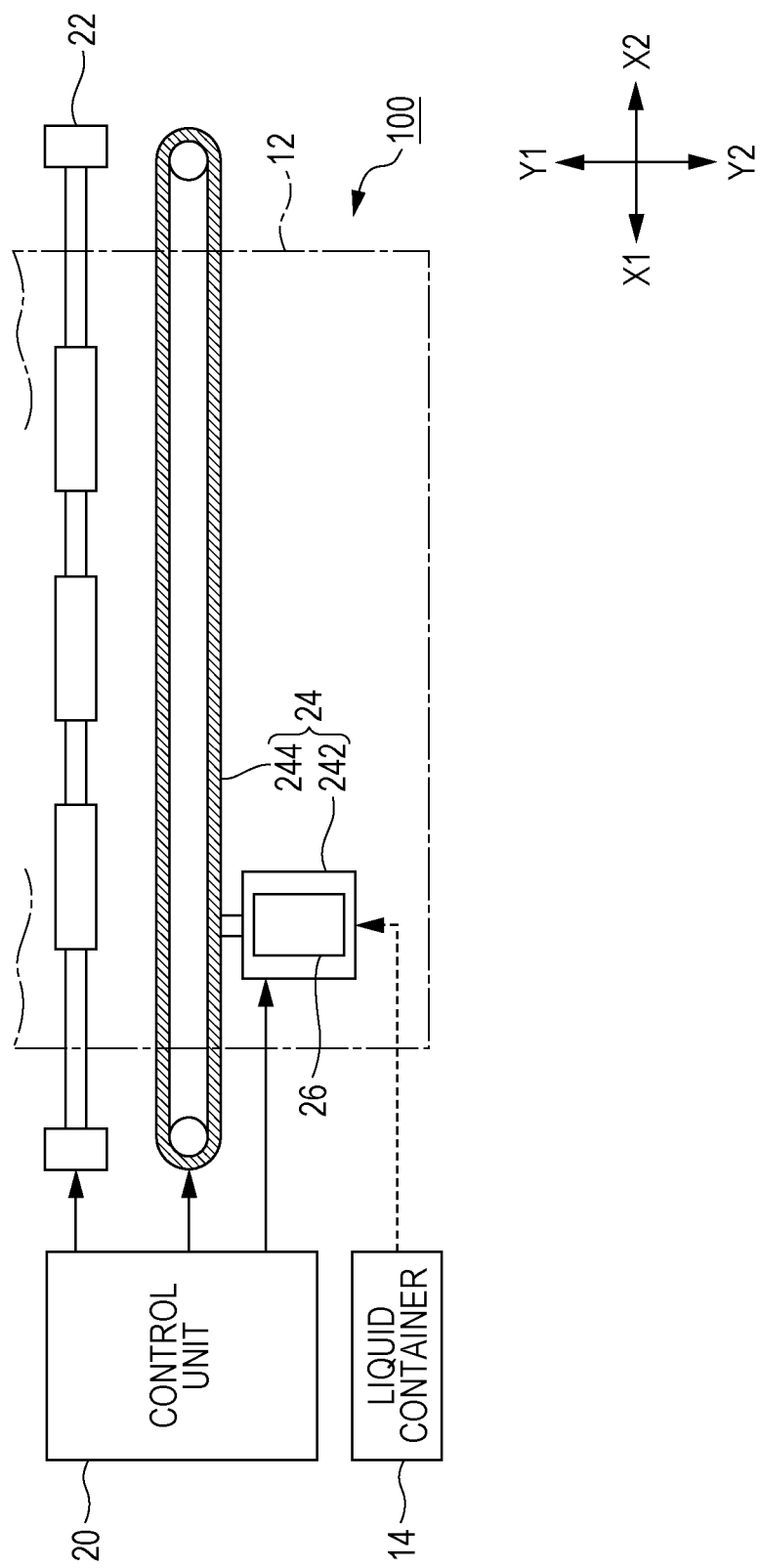
FIG. 1 is a view illustrating a configuration of a liquid ejecting apparatus according to a first embodiment.

FIG. 1 is a view illustrating a configuration of a liquid ejecting apparatus 100 according to a first embodiment of the invention. The liquid ejecting apparatus 100 of the first embodiment is an ink jet printing device configured to eject ink as an example of liquid onto a medium (ejection target) 12. The medium 12 is typically a print paper sheet. A print target such as a resin film or fabric having desired quality of material is adopted as the medium 12. As illustrated in FIG. 1, a liquid container 14 which stores ink is installed in the liquid ejecting apparatus 100. For example, a cartridge, an ink pack in the form of a pouch made of flexible film, or an ink tank into which ink is replenishable is adopted as the liquid container 14. The cartridge, the ink pack, and the ink tank are detachable from and attachable to the liquid ejecting apparatus 100.

As illustrated in FIG. 1, the liquid ejecting apparatus 100 includes a control unit 20, a transport mechanism 22, a movement mechanism 24, and a liquid ejection head 26. The control unit 20 includes a processing circuit such as a central processing unit (CPU), a field programmable gate array (FPGA), or the like and memory circuit such as semiconductor memory and generally controls elements of the liquid ejecting apparatus 100. The transport mechanism 22 transports the medium 12 in the Y direction (Y1, Y2) under the control of the control unit 20.

The movement mechanism 24 reciprocates the liquid ejection head 26 in the X direction (X1, X2) under the control of the control unit 20. The X direction is a direction which intersects (is typically orthogonal to) the Y direction in which the medium 12 is transported. The movement mechanism 24 of the first embodiment includes a transport body 242 (carriage) and a transport belt 244 to which the transport body 242 is fixed. The transport body 242 accommodates the liquid ejection head 26 and is substantially box-shaped. Note that a plurality of liquid ejection heads 26 may be mounted on the transport body 242, or the liquid container 14 and the liquid ejection head 26 may be mounted on the transport body 242.

The liquid ejection head 26 ejects ink from a plurality of nozzles (ejection holes) onto the medium 12 under the control of the control unit 20. The ink is supplied from the liquid container 14. Each liquid ejection head 26 ejects ink onto the medium 12 concurrently with transportation of the medium 12 by the transport mechanism 22 and repeated reciprocation of the transport body 242, thereby forming a desired image on a surface of the medium 12.

Figure 2:
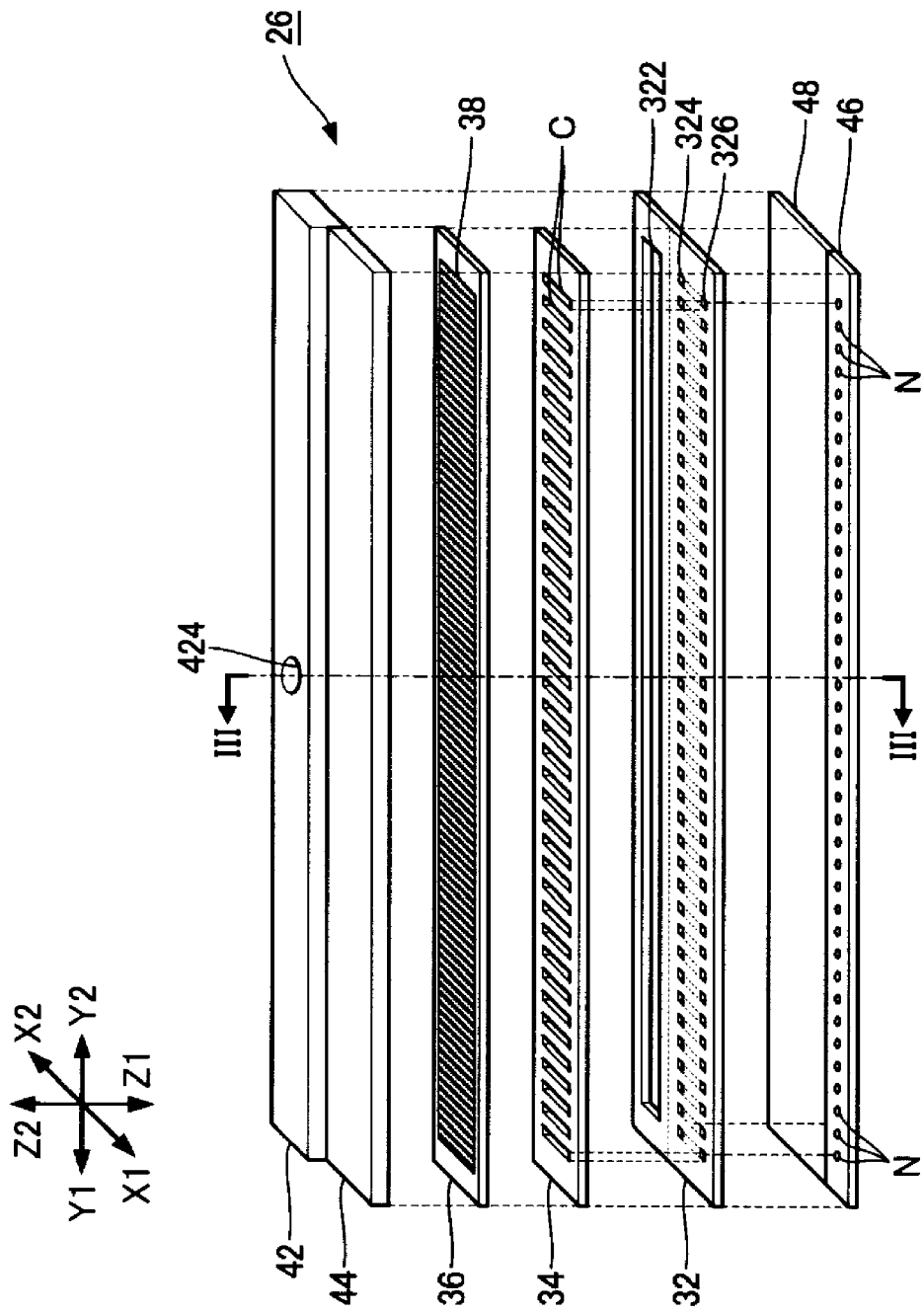
FIG. 2 is an exploded perspective view illustrating a liquid ejection head.
Figure 3:
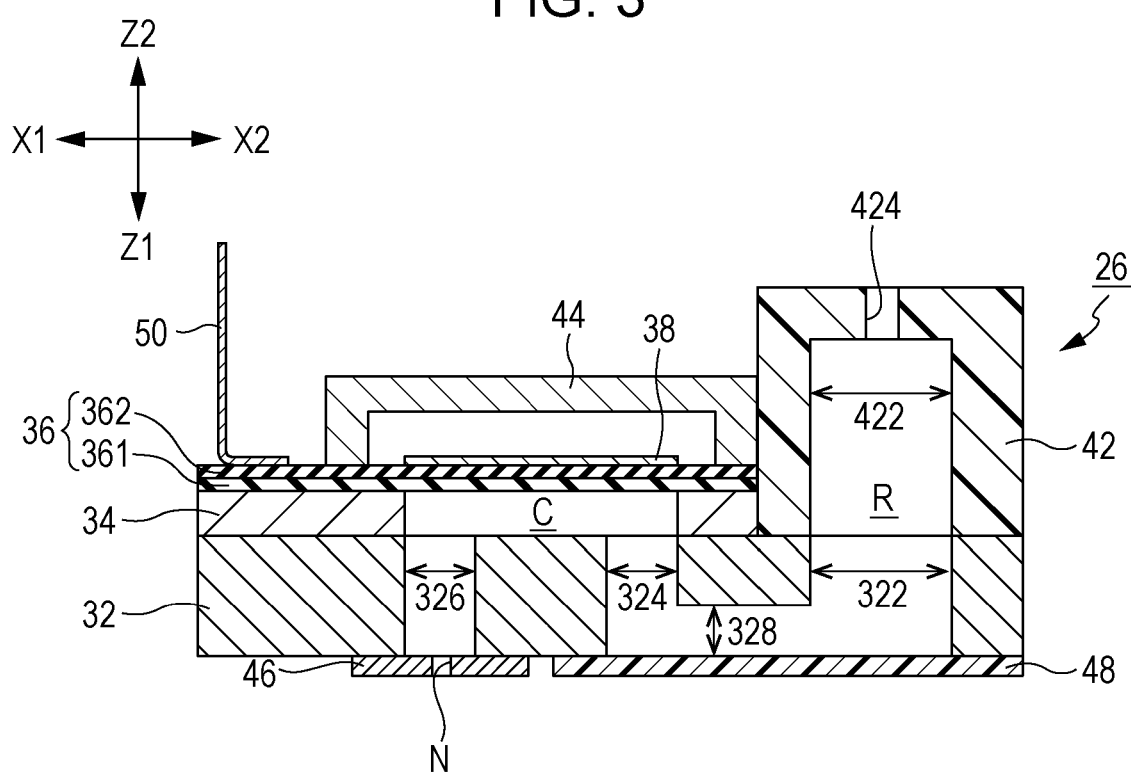
FIG. 3 is a sectional view (sectional view taken along line III-III of FIG. 2) of the liquid ejection head.

FIG. 2 is an exploded perspective view illustrating the liquid ejection head 26. FIG. 3 is a sectional view taken along line III-III (sectional view parallel to the X-Z plane) of FIG. 2. As shown in FIG. 2, a direction perpendicular to the X-Y plane (for example, a plane parallel to the surface of the medium 12) is hereinafter denoted as the Z direction (Z1, Z2). An ejection direction (typically the vertical direction) of ink from each liquid ejection head 26 corresponds to the Z direction. Note that as illustrated in FIG. 2, in the following description, one side in the X direction is denoted as "X1 side" and the other side in the X direction is denoted as "X2 side". Similarly, one side in the Y direction is denoted as "Y1 side", the other side in the Y direction is denoted as "Y2 side", one side in the Z direction is denoted as "Z1 side", and the other side in the Z direction is denoted as "Z2 side".

As illustrated in FIGS. 2 and 3, the liquid ejection head 26 includes a flow path substrate 32 having a substantially rectangular shape which is long in the Y direction. The flow path substrate 32 has a surface which is located on the Z2 side in the Z direction and on which a pressure chamber substrate 34, a diaphragm 36, a plurality of piezoelectric devices 38, a housing 42, and a sealing body 44 are disposed. On the other hand, the flow path substrate 32 has a surface which is located on the Z1 side in the Z direction and on which a nozzle plate 46 and a vibration absorber 48 are disposed. Schematically similarly to the flow path substrate 32, the elements of the liquid ejection head 26 are plate-like members which are long in the Y direction, and the elements of the liquid ejection head 26 are bonded to each other by, for example, an adhesive.

As illustrated in FIG. 2, the nozzle plate 46 is a plate-like member having a plurality of nozzles N aligned in the Y direction. Each nozzle N is a through hole through which ink passes. Note that the flow path substrate 32, the pressure chamber substrate 34, and the nozzle plate 46 are formed by processing a monocrystalline substrate made of, for example, silicon (Si) by a semiconductor fabrication technique such as etching. Note that the material and the fabrication method of each element of the liquid ejection head 26 are arbitrary. The Y direction can also be referred to as a direction in which the plurality of nozzles N are aligned.

The flow path substrate 32 is a plate-like member for forming a flow path of ink. As illustrated in FIGS. 2 and 3, the flow path substrate 32 has an opening 322, supply flow paths 324, and communication flow paths 326. The opening 322 is a through hole which is long along the Y direction in plan view (that is, viewed from the Z direction) and which is continuous over the plurality of nozzles N. On the other hand, the supply flow paths 324 and the communication flow paths 326 are through holes individually formed for the nozzles N. Moreover, as illustrated in FIG. 3, a relay flow path 328 extending over the plurality of supply flow paths 324 is formed in the surface of the flow path substrate 32 on the Z1 side in the Z direction. The relay flow path 328 is a flow path through which the opening 322 and the plurality of supply flow paths 324 are in communication with each other.

The housing 42 is a structure formed by injection molding of, for example, a resin material and is fixed to the surface of the flow path substrate 32 on the Z2 side in the Z direction. As illustrated in FIG. 3, the housing 42 has an accommodation section 422 and an inlet port 424. The accommodation section 422 is a recess having an outer shape corresponding to the opening 322 of the flow path substrate 32, and the inlet port 424 is a through hole in communication with the accommodation section 422. As can be seen from FIG. 3, a space formed by the opening 322 of the flow path substrate 32 and the accommodation section 422 of the housing 42 which are in communication with each other serves as a liquid storage chamber (reservoir) R. Ink which is supplied from the liquid container 14 and passes through the inlet port 424 is accumulated in a liquid storage chamber R.

The vibration absorber 48 is an element for absorbing pressure variation in the liquid storage chamber R and includes, for example, a flexible sheet member (compliance substrate) which is elastically deformable. Specifically, the vibration absorber 48 is disposed on the surface of the flow path substrate 32 on the Z1 side in the Z direction such that the opening 322, the relay flow path 328, and the plurality of supply flow paths 324 of the flow path substrate 32 are closed, and a bottom surface of the liquid storage chamber R is constituted.

As illustrated in FIGS. 2 and 3, the pressure chamber substrate 34 is a plate-like member having a plurality of pressure chambers C (cavities) corresponding to the respective nozzles N. The plurality of pressure chambers C are aligned along the Y direction. Each pressure chamber C is an opening which is long along the X direction in plan view X. Each pressure chamber C has an end on the X2 side in the X direction, and the end overlaps one supply flow path 324 of the flow path substrate 32 in plan view. Each pressure chamber C has an end on the X1 side in the X direction, and the end overlaps one communication flow path 326 of the flow path substrate 32 in plan view.

The pressure chamber substrate 34 has a surface which is located opposite to the flow path substrate 32 and on which the diaphragm 36 is disposed. The diaphragm 36 is a plate-like member which is elastically deformable. As illustrated in FIG. 3, the diaphragm 36 of the first embodiment includes a first layer 361 and a second layer 362 which are stacked. The second layer 362 is located on a side of the first layer 361 opposite to the pressure chamber substrate 34. The first layer 361 is an elastic film made of an elastic material such as silicon oxide ($SiO_2$), and the second layer 362 is an insulating film made of an insulating material such as zirconium oxide ($ZrO_2$). Note that selectively removing part of a plate-like member having a prescribed thickness in a region corresponding to the pressure chamber C in a plate thickness direction also enables part or the entirety of the pressure chamber substrate 34 and the diaphragm 36 to be integrally formed.

As can be seen from FIG. 3, the flow path substrate 32 and the diaphragm 36 face each other with a space therebetween in each pressure chamber C. Each pressure chamber C is a space located between the flow path substrate 32 and the diaphragm 36 and is configured to apply pressure to ink filled in the pressure chamber C. Ink accumulated in the liquid storage chamber R is separated from the relay flow path 328 into the supply flow paths 324 and is supplied to and filled in the plurality of pressure chambers C in parallel. As can be seen from the above description, the diaphragm 36 constitutes a wall surface of the pressure chamber C (specifically, an upper surface which is one surface of the pressure chamber C).

As illustrated in FIGS. 2 and 3, the diaphragm 36 has a surface which is located opposite to the pressure chamber C (that is, a surface of the second layer 362) and on which the plurality of piezoelectric devices 38 corresponding to the respective nozzles N (or pressure chambers C) are disposed. Each piezoelectric device 38 is an actuator which deforms when supplied with a drive signal and has a shape which is long along the X direction in plan view. The plurality of piezoelectric devices 38 are aligned in the Y direction so as to correspond to the plurality of pressure chambers C. When the diaphragm 36 vibrates along with the deformation of the piezoelectric device 38, the pressure in the pressure chamber C varies, and thereby the ink filled in the pressure chamber C is ejected through the communication flow path 326 and the nozzle N.

The sealing body 44 in FIGS. 2 and 3 is a structure for protecting the plurality of piezoelectric devices 38 and for reinforcing the mechanical strength of the pressure chamber substrate 34 and the diaphragm 36, and the sealing body 44 is fixed to the surface of the diaphragm 36 with, for example, an adhesive. The sealing body 44 has a surface facing the diaphragm 36 and having a recess which accommodates the plurality of piezoelectric devices 38.

As illustrated in FIG. 3, for example, a wiring substrate 50 is connected to the surface of the diaphragm 36 (or on the surface of the pressure chamber substrate 34). The wiring substrate 50 is a mounting component provided with a plurality of wires (not shown) for electrically connecting the control unit 20 or a power supply circuit (not shown) to the liquid ejection head 26. For example, a flexible printed circuit (FPC), a flexible flat cable (FFC) or the like is preferably adopted as the flexible wiring substrate 50. The drive signal for driving the piezoelectric device 38 is supplied from the wiring substrate 50 to the piezoelectric devices 38.

Figure 4:
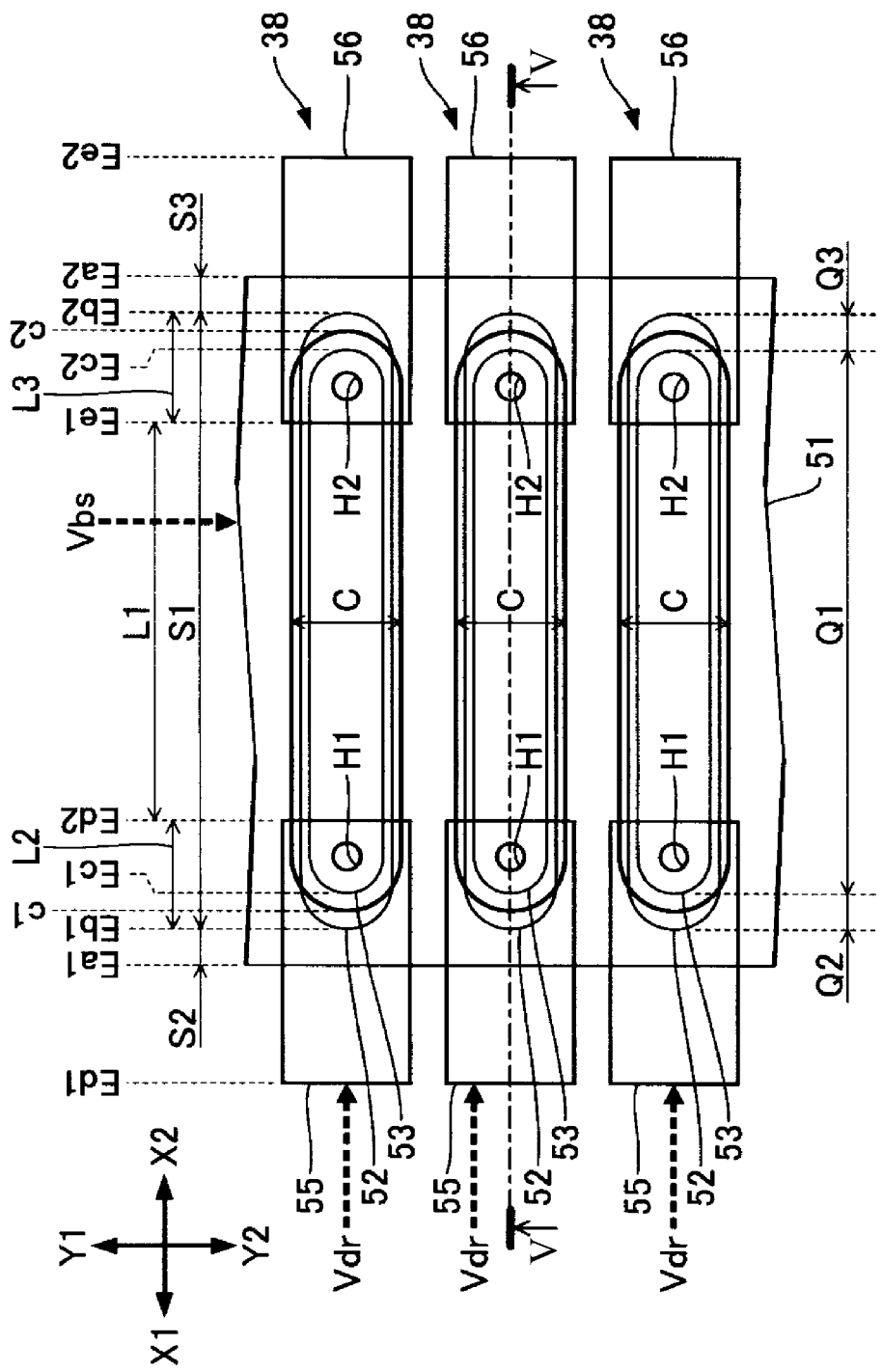
FIG. 4 is a plan view illustrating a plurality of piezoelectric devices.

A specific configuration of each piezoelectric device 38 will be described in detail below. FIG. 4 is plan view illustrating the plurality of piezoelectric devices 38. Note that in FIG. 4, the rim of an element located behind any one element (portion which is actually hidden by the element on the front side) is also shown accordingly. Moreover, FIG. 5 is a sectional view taken along line V-V of FIG. 4 (sectional view taken along the longitudinal direction of the piezoelectric device 38).

Figure 5:
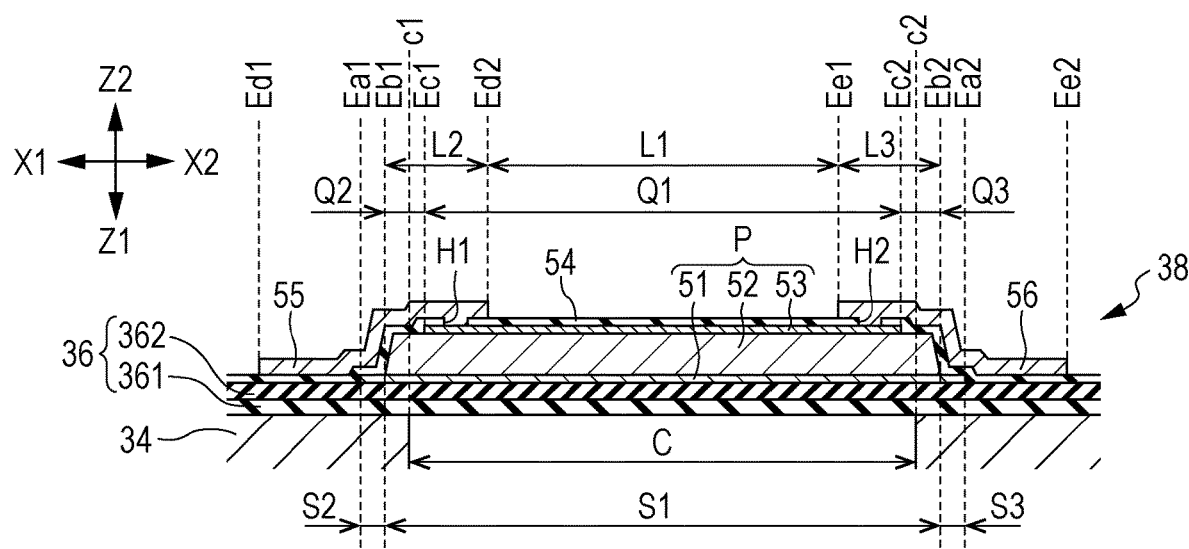
FIG. 5 is a sectional view taken along line V-V of FIG. 4.

As illustrated in FIGS. 4 and 5, each piezoelectric device 38 includes a lamination layer including a first electrode 51, a piezoelectric layer 52, a second electrode 53, an insulating layer 54, a first wire 55, and a second wire 56. Note that in the present specification, the expression "an element A and an element B are stacked" is not limited to a configuration in which the element A and the element B are directly in contact with each other. That is, a configuration in which another element C is disposed between the element A and the element B is included in the concept expressed by "an element A and an element B are stacked". Moreover, the expression "an element B is formed on a surface of an element A" is also not limited to a configuration in which the element A and the element B are directly in contact with each other. That is, a configuration in which an element C is formed on a surface of the element A, and the element B is formed on a surface of the element C is included in the concept expressed by "an element B is formed on a surface of an element A" as long as the element A and the element B at least partially overlap each other in plan view.

The first electrode 51 is formed on a surface of the diaphragm 36 (specifically, a surface of the second layer 362). Specifically, the first electrode 51 is a belt-like common electrode extending in the Y direction continuously over the plurality of piezoelectric devices 38 (or the plurality of pressure chambers C). To an end of first electrode 51 in the Y direction, a prescribed reference voltage Vbs is applied from, for example, the wiring substrate 50.

The piezoelectric layers 52 are formed on a surface of the first electrode 51. The piezoelectric layers 52 are formed for the respective piezoelectric devices 38 (or for the respective pressure chambers C) and overlap the pressure chambers C in plan view. That is, the plurality of piezoelectric layers 52 which are long in the X direction are aligned in the Y direction with intervals therebetween. The material of the piezoelectric layers 52 or the method for fabricating the piezoelectric layers 52 is arbitrary. For example, a thin film made of a piezoelectric material such as lead zirconate titanate is formed by a known film forming technique such as sputtering, and the thin film is selectively removed by a known processing technique such as photolithography to form the piezoelectric layers 52.

As illustrated in FIGS. 4 and 5, each piezoelectric layer 52 has an end Eb1 (an example of a first end) on the X1 side in the X direction, and the end Eb1 is located on the X2 side in the X direction viewed from an end Ea1 of the first electrode 51 on the X1 side. Moreover, the piezoelectric layer 52 has an end Eb2 (an example of a second end) on the X2 side in the X direction, and the end Eb2 is located on the X1 side in the X direction viewed from an end Ea2 of the first electrode 51 on the X2 side. As can be seen from the above description, each piezoelectric layer 52 is located within an area in which the first electrode 51 is formed. That is, as illustrated in FIGS. 4 and 5, the first electrode 51 includes a first portion S1 on which the piezoelectric layer 52 is stacked, and a second portion S2 and a third portion S3 where the piezoelectric layer 52 is not stacked. The first portion S1 is a region in which the first electrode 51 and the piezoelectric layer 52 overlap each other in plan view. The second portion S2 and the third portion S3 are regions corresponding to parts of the first electrode 51 and extending beyond the rim of the piezoelectric layer 52 in the X direction in plan view. Moreover, the first portion S1 is a region between the second portion S2 and the third portion S3 in plan view. The second portion S2 is a region on the X1 side (a side adjacent to the end Ea1) in the X direction viewed from the first portion S1. The third portion S3 is a region on a side of the first portion S1 opposite to the second portion S2 (on the X2 side in the X direction viewed from the first portion S1).

The second electrode 53 is formed on a surface of the piezoelectric layer 52. The second electrodes 53 are individual electrodes formed for the respective piezoelectric devices 38 (or for the respective pressure chambers C). Specifically, the plurality of second electrodes 53 extending in the X direction are aligned in the Y direction with intervals therebetween. The material of the second electrodes 53 or the method for fabricating the second electrodes 53 is arbitrary. For example, a thin film made of a conductive material such as platinum or iridium is formed by a known film forming technique such as sputtering, and the thin film is selectively removing by a known processing technique such as photolithography, thereby forming the second electrode 53.

The second electrode 53 has an end Ec1 on the X1 side in the X direction, and the end Ec1 is located on the X2 side in the X direction viewed from the end Eb1 of the piezoelectric layer 52. Moreover, the second electrode 53 has an end Ec2 on the X2 side in the X direction, and the end Ec2 is located on the X1 side in the X direction viewed from the end Eb2 of the piezoelectric layer 52. Moreover, the second electrode 53 is located in the piezoelectric layer 52 in the Y direction. As can be seen from the above description, the second electrode 53 is located within an area in which the piezoelectric layer 52 is formed.

As illustrated in FIG. 5, a piezoelectric element P includes a lamination layer of the first electrode 51, the piezoelectric layer 52, and the second electrode 53. The piezoelectric elements P are individually formed for the respective pressure chambers C (or the respective nozzles N). Specifically, a plurality of piezoelectric elements P which are long in the X direction are aligned in the Y direction with intervals therebetween. Each piezoelectric layer 52 has a section (a so-called active section) between the first electrode 51 and the second electrode 53, and the section deforms in accordance with a voltage difference between the reference voltage Vbs applied to the first electrode 51 and the drive signal Vdr supplied to the second electrode 53. Note that the Z direction may also be referred to as a direction in which the plurality of layers included in the piezoelectric element P are stacked.

The insulating layer 54 is an insulating coating film covering the surface of the diaphragm 36 provided with the plurality of piezoelectric elements P. That is, the insulating layer 54 covers the first electrode 51, the piezoelectric layer 52, and the second electrode 53. The insulating layer 54 is made of an insulating material such as silicon oxide ($SiO_x$) or silicon nitride ($SiN_x$).

The first wire 55 is a conductive layer formed on a surface of the insulating layer 54. The first wires 55 are formed for the respective piezoelectric elements P (or for the respective pressure chambers C). Specifically, the plurality of first wires 55 which are long in the X direction are aligned in the Y direction with intervals therebetween.

As illustrated in FIGS. 4 and 5, the first wire 55 is formed on a side adjacent to the end Eb1 of the piezoelectric layer 52. That is, the first wire 55 overlaps the end Eb1 of the piezoelectric layer 52 in plan view. Specifically, the first wire 55 has an end Ed1 on the X1 side in the X direction, and the end Ed1 is located on the X1 side in the X direction viewed from the end Ea1 of the first electrode 51. Moreover, the first wire 55 has an end Ed2 on the X2 side in the X direction, and the end Ed2 is located on the X2 side in the X direction viewed from the end Ec1 of the second electrode 53. As can be seen from the above description, the first wire 55 is continuous over the surfaces of the piezoelectric layer 52 and the second electrode 53 and the surface of the second portion S2 of the first electrode 51 (portion which does not overlap the piezoelectric layer 52). Note that in FIG. 4, a configuration in which the first wire 55 is wider than the piezoelectric layer 52 is shown, but the width of the first wire 55 may be arbitrarily.

The first wire 55 has a portion which is adjacent to the end Ed2, which is located on the surface of the piezoelectric layer 52, and which is electrically connected to the second electrode 53 via a contact hole H1 (an example of the first contact hole) formed in the insulating layer 54. Moreover, the first wire 55 has a portion which is on the X1 side in the X direction viewed from the end Eb1 of the piezoelectric layer 52 and which overlaps the second portion S2 of the first electrode 51 in plan view with the insulating layer 54 disposed between the second portion S2 and the portion of the first wire 55. Thus, the first wire 55 (and the second electrode 53) is (are) electrically insulated from the first electrode 51. The first wire 55 has a portion which is adjacent to the end Ed1 and which is electrically connected to the wire of the wiring substrate 50. In the above configuration, the drive signal Vdr supplied from the wiring substrate 50 (an example of the external circuit) to the first wire 55 is supplied to the second electrode 53 via the first wire 55.

The second wire 56 is a conductive layer formed on a surface of the insulating layer 54. The second wires 56 are formed for the respective piezoelectric elements P (or for the respective pressure chambers C). Specifically, a plurality of the second wires 56 which are long in the X direction are aligned in the Y direction with intervals therebetween.

As illustrated in FIGS. 4 and 5, the second wire 56 is formed on a side adjacent to the end Eb2 of the piezoelectric layer 52. That is, the second wire 56 overlaps the end Eb2 of the piezoelectric layer 52 in plan view. Specifically, the second wire 56 has an end Ee1 on the X1 side in the X direction, and the end Ee1 is located on the X1 side in the X direction viewed from the end Ec2 of the second electrode 53. Moreover, the second wire 56 has an end Ee2 on the X2 side in the X direction, and the end Ee2 is located on the X2 side in the X direction viewed from the end Ea2 of the first electrode 51. As can be seen from the above description, the second wire 56 is continuous over the surfaces of the piezoelectric layer 52 and the second electrode 53 and a surface of the third portion S3 of the first electrode 51 (portion which does not overlap the piezoelectric layer 52). That is, the first wire 55 and the second wire 56 are schematically plane symmetric substantially with the Y-Z plane between the first wire 55 and the second wire 56. Note that in the configuration shown in FIG. 4, the second wire 56 is wider than the piezoelectric layer 52, but the width of the second wire 56 may be arbitrarily.

The second wire 56 has a portion which is on the X2 side in the X direction viewed from the end Eb2 of the piezoelectric layer 52 and which overlaps the third portion S3 of the first electrode 51 in plan view with the insulating layer 54 disposed between the third portion S3 and the portion of the second wire 56. That is, the second wire 56 and the first electrode 51 are electrically insulated. On the other hand, the second wire 56 has a portion which is on a side adjacent to the end Ee1 and which overlaps the portion of the second electrode 53 adjacent to the end Ec2 on the surface of the piezoelectric layer 52 in plan view. The portion of the second wire 56 which is on the side adjacent to the end Ee1 and which is located on a surface of the piezoelectric layer 52 is electrically connected to the second electrode 53 via a contact hole H2 (an example of the second contact hole) formed in the insulating layer 54. That is, the second wire 56 is electrically connected to the wire on the wiring substrate 50 via the second electrode 53 and the first wire 55. Thus, the drive signal Vdr supplied from the wiring substrate 50 to the first wire 55 is also supplied to the second wire 56 via the second electrode 53.

The first wire 55 and the second wire 56 are collectively formed by selectively removing a common conductive layer (single layer or a plurality of layers). Thus, the first wire 55 and the second wire 56 are made of a common conductive material and have substantially the same thickness. For example, a conductive layer made of metal such as gold having a low resistance is formed by a known film forming technique such as sputtering, and the conductive layer is selectively removed by a known processing technique such as photolithography, thereby collectively forming the first wire 55 and the second wire 56. The thicknesses of the first wire 55 and the second wire 56 are each larger than the thickness of the second electrode 53. For example, the second electrode 53 has a sufficiently small thickness so as not to excessively suppress the deformation of the piezoelectric layer 52. On the other hand, appropriate thicknesses are secured for the first wire 55 and the second wire 56 so as to sufficiently reduce the wiring resistance.

As illustrated in FIGS. 4 and 5, the area of each piezoelectric device 38 in which the piezoelectric layer 52 is formed is divided into a first region Q1, a second region Q2, and a third region Q3 in plan view. The second region Q2 is a region of the piezoelectric layer 52 adjacent to the end Eb1, and the third region Q3 is a region of the piezoelectric layer 52 adjacent to the end Eb2. The first region Q1 is a region between the second region Q2 and the third region Q3. That is, the second region Q2 is located on the X1 side in the X direction viewed from the first region Q1, and the third region Q3 is located on the X2 side in the X direction viewed from the first region Q1.

The first region Q1 is a region in which the first electrode 51 and the second electrode 53 face each other. Thus, in the first region Q1 (active section), the first electrode 51, the piezoelectric layer 52, and the second electrode 53 are stacked in this order from the diaphragm 36. On the other hand, the second region Q2 is a region in which the first wire 55 is formed. Thus, in the second region Q2, the first electrode 51, the piezoelectric layer 52, the insulating layer 54, and the first wire 55 are stacked in this order from the diaphragm 36. Moreover, the third region Q3 is a region in which the second wire 56 is formed. Thus, in the third region Q3, the first electrode 51, the piezoelectric layer 52, the insulating layer 54, and the second wire 56 are stacked in this order from the diaphragm 36.

Figure 6:
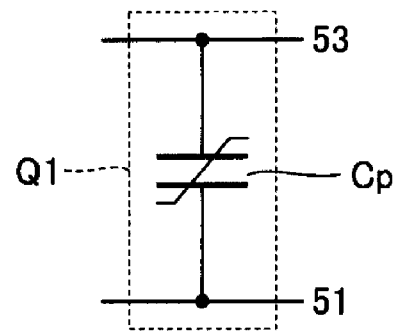
FIG. 6 is a circuit diagram illustrating electrical components in a first region.
Figure 7:
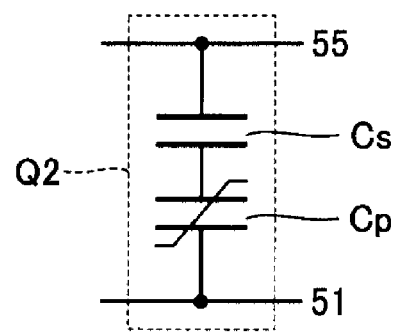
FIG. 7 is a circuit diagram illustrating electrical components in a second region.
Figure 8:
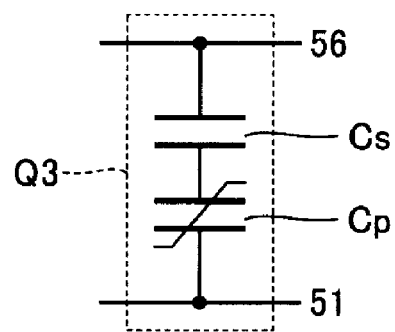
FIG. 8 is a circuit diagram illustrating electrical components in a third region.

As illustrated in FIG. 6, in the first region Q1, a capacitive element Cp including the piezoelectric layer 52 as a dielectric is formed between the first electrode 51 and the second electrode 53. On the other hand, in the second region Q2, the piezoelectric layer 52 and the insulating layer 54 are disposed between the first electrode 51 and the first wire 55. That is, in the second region Q2, as illustrated in FIG. 7, the capacitive element Cp including the piezoelectric layer 52 as the dielectric and a capacitive element Cs including the insulating layer 54 as a dielectric are connected in series between the first electrode 51 and the first wire 55. In the third region Q3, the piezoelectric layer 52 and the insulating layer 54 are disposed between the first electrode 51 and the second wire 56. That is, in the third region Q3, as illustrated in FIG. 8, the capacitive element Cp including the piezoelectric layer 52 as the dielectric and a capacitive element Cs including the insulating layer 54 as a dielectric are connected in series between the first electrode 51 and the second wire 56.

As described above, in the first embodiment, the second wire 56 is formed in the longitudinal direction (X direction) of the piezoelectric layer 52 opposite to the first wire 55. In the above configuration, the mechanical stiffness of a portion of the piezoelectric layer 52 adjacent to the end Eb2 is secured equivalently to that of a portion of the piezoelectric layer 52 adjacent to the end Eb1 at which the first wire 55 is formed. This can reduce the occurrence of cracks in the piezoelectric layer 52 in the periphery of the end Eb2 and/or the diaphragm 36.

Figure 9:
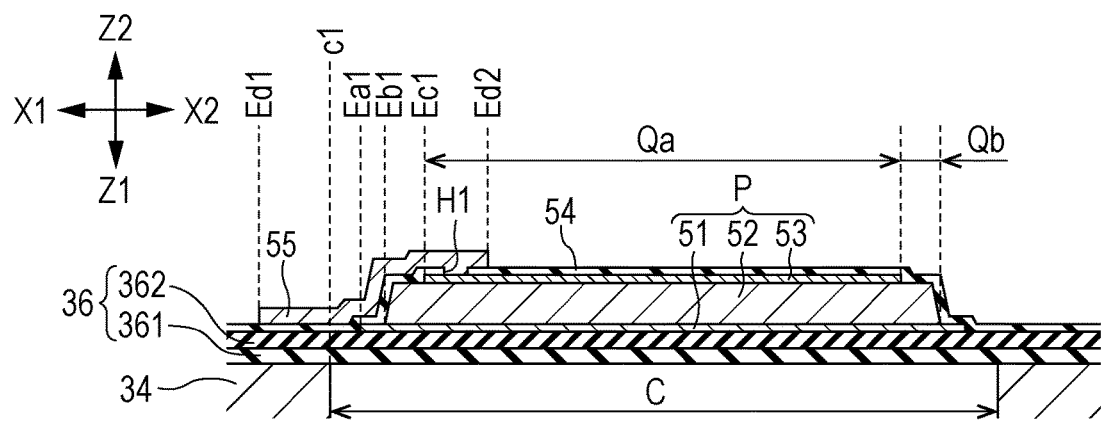
FIG. 9 is sectional view illustrating a piezoelectric device according to a first comparative example.

FIG. 9 is a sectional view illustrating a configuration in which the second wire 56 is not formed (hereinafter referred to as "first comparative example"). As illustrated in FIG. 9, the first comparative example has a region Qa in which a first electrode 51 and a second electrode 53 face each other and in which a voltage Va corresponding to a difference between a reference voltage Vbs and a drive signal Vdr is applied to a piezoelectric layer 52. On the other hand, in a region Qb located on the X2 side in the X direction viewed from the region Qa, no voltage is applied to the piezoelectric layer 52. That is, the piezoelectric layer 52 deforms in accordance with the voltage Va in the region Qa but does not deform in the region Qb. Thus, a local stress difference is caused at an interface between the region Qa and the region Qb, and a crack may be formed in the piezoelectric layer 52.

In contrast, in the third region Q3 of the first embodiment, the piezoelectric layer 52 and the insulating layer 54 are disposed between the first electrode 51 and the second wire 56. In this configuration, the voltage Va between the first electrode 51 and the second wire 56 is divided by the capacitive element Cs and the capacitive element Cp of FIG. 8. Thus, the voltage Vb applied to the piezoelectric layer 52 is lower than the voltage Va between the first electrode 51 and the second wire 56. That is, a voltage applied to the piezoelectric layer 52 in the third region Q3 is lower than a voltage applied to the piezoelectric layer 52 in the first region Q1. Thus, the stress difference caused at the interface between the first region Q1 and the third region Q3 in the piezoelectric layer 52 is smaller than that in the first comparative example. That is, the first embodiment has the advantage that the occurrence of cracks in the piezoelectric layer 52 can be reduced not only from the aspect of the mechanical stiffness but also from the electrical aspect described above.

A positional relationship in plan view between the pressure chamber C and the piezoelectric device 38 will be described. In the following description, as illustrated in FIGS. 4 and 5, a portion at which a wall surface of the pressure chamber C on the X1 side in the X direction and the surface of the diaphragm 36 (surface of the first layer 361) intersect with each other is denoted as an end c1 (an example of the first end of the pressure chamber). Moreover, a portion at which a wall surface of the pressure chamber C on the X2 side in the X direction and the surface of the diaphragm 36 intersect with each other is denoted as an end c2 (an example of the second end of the pressure chamber).

In FIGS. 4 and 5, a first laminate region L1, a second laminate region L2, and a third laminate region L3 are illustrated. The first laminate region L1 is a region in which the first electrode 51, the piezoelectric layer 52, and the second electrode 53 are stacked in this order.

The second laminate region L2 is a region located adjacent to the end Eb1 of the piezoelectric layer 52 viewed from the first laminate region L1. In the second laminate region L2, the first electrode 51, the piezoelectric layer 52, the third electrode 53, the insulating layer 54, and the first wire 55 are stacked in this order. Specifically, a region between the end Eb1 of the piezoelectric layer 52 and the end Ed2 of the first wire 55 corresponds to the second laminate region L2. The second region Q2 described above is included in the second laminate region L2.

The third laminate region L3 is a region located adjacent to the end Eb2 of the piezoelectric layer 52 viewed from the first laminate region L1. In the third laminate region L3, the first electrode 51, the piezoelectric layer 52, the third electrode 53, the insulating layer 54, and the second wire 56 are stacked in this order. Specifically, a region between the end Eb2 of the piezoelectric layer 52 and the end Ee1 of the second wire 56 corresponds to the third laminate region L3. The third region Q3 described above is included in the third laminate region L3.

As illustrated in FIGS. 4 and 5, the end c1 of the pressure chamber C on the X1 side in the X direction overlaps the second laminate region L2 in plan view. That is, the end c1 is located between the end Eb1 of the piezoelectric layer 52 and the end Ed2 of the first wire 55. The end c1 of the pressure chamber C in the first embodiment overlaps in particular the second region Q2 of the second laminate region L2 in plan view. That is, the end c1 is located between the end Eb1 of the piezoelectric layer 52 and the end Ec1 of the second electrode 53.

On the other hand, as illustrated in FIGS. 4 and 5, the end c2 of the pressure chamber C on the X2 side in the X direction overlaps the third laminate region L3 in plan view. That is, the end c2 is located between the end Eb2 of the piezoelectric layer 52 and the end Ee1 of the second wire 56. The end c2 of the pressure chamber C in the first embodiment overlaps in particular the third region Q3 of the third laminate region L3 in plan view. That is, the end c2 is located between the end Eb2 of the piezoelectric layer 52 and the end Ec2 of the second electrode 53.

Figure 10:
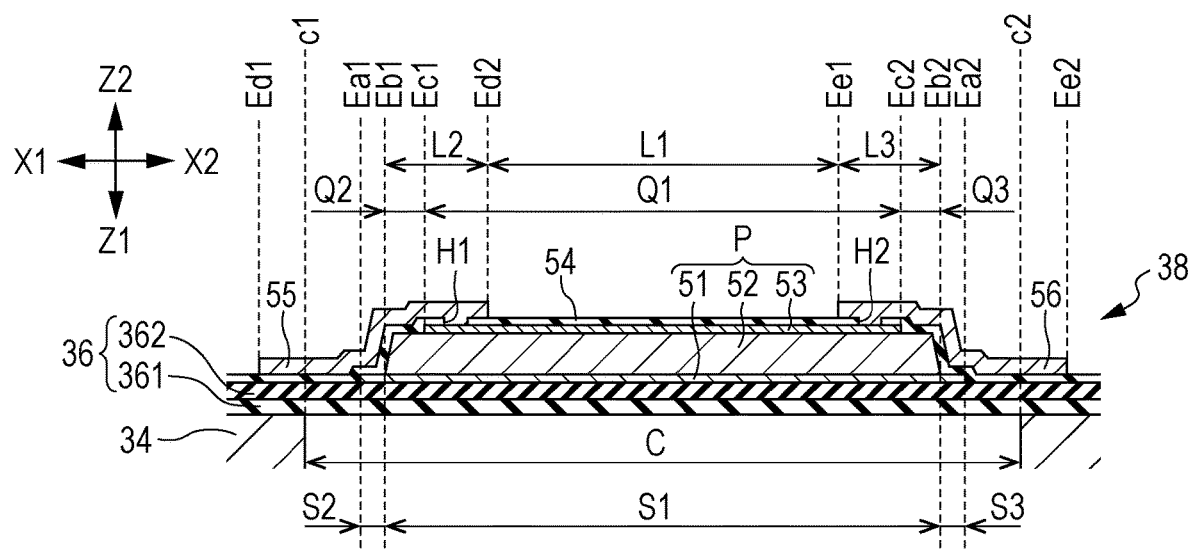
FIG. 10 is sectional view illustrating a piezoelectric device according to a second comparative example.

FIG. 10 is a sectional view illustrating a configuration (hereinafter referred to as "second comparative example") in which an end c1 of a pressure chamber C is located outside a second laminate region L2 and an end c2 of the pressure chamber C is located outside a third laminate region L3. In the second comparative example, the end c1 is located on the X1 side in the X direction viewed from an end Eb1 of a piezoelectric layer 52, and the end c2 is located on the X2 side in the X direction viewed from an end Eb2 of the piezoelectric layer 52.

A diaphragm 36 has a region located outside the pressure chamber C, and the region is connected to a pressure chamber substrate 34 to limit dislocation. On the other hand, the diaphragm 36 has a region located inside the pressure chamber C, and the region is more easily dislocated than the region outside the pressure chamber C. Thus, a local stress difference is caused at a portion of the diaphragm 36 which overlaps the end c1 or the end c2 of the pressure chamber C (that is, an interface between the interior and the exterior of the pressure chamber C), and cracks are likely to be formed in the diaphragm 36. In the second comparative example, the end c1 is located in a region in which two layers, an insulating layer 54 and a first wire 55, are stacked, and the end c2 is located in a region in which two layers, the insulating layer 54 and a second wire 56 are stacked.

In contrast, in the second region Q2 of the second laminate region L2, the first electrode 51, the piezoelectric layer 52, the insulating layer 54, and the first wire 55 are stacked, thereby reinforcing the mechanical strength of the diaphragm 36. In the first embodiment, the end c1 of the pressure chamber C overlaps the second region Q2 of the second laminate region L2 in plan view for which the mechanical strength is secured as described above. Thus, according to the first embodiment, the occurrence of cracks in the diaphragm 36 in the periphery of the end c1 can be reduced more than in the second comparative example.

Moreover, in a third region Q3 of the third laminate region L3, the first electrode 51, the piezoelectric layer 52, the insulating layer 54, and the second wire 56 are stacked, thereby reinforcing the mechanical strength of the diaphragm 36. In the first embodiment, the end c2 of the pressure chamber C overlaps the third region Q3 of the third laminate region L3 in plan view for which the mechanical strength is secured as described above. Thus, according to the first embodiment, the occurrence of cracks in the diaphragm 36 in the periphery of the end c2 can be reduced more than in the second comparative example.

Second Embodiment

A second embodiment of the invention will be described below. Note that in each aspect illustrated below, elements having the same operation or functions as those in the first embodiment are denoted by the same reference signs as those used in the description in the first embodiment, and the detailed description thereof is accordingly omitted.

Figure 11:
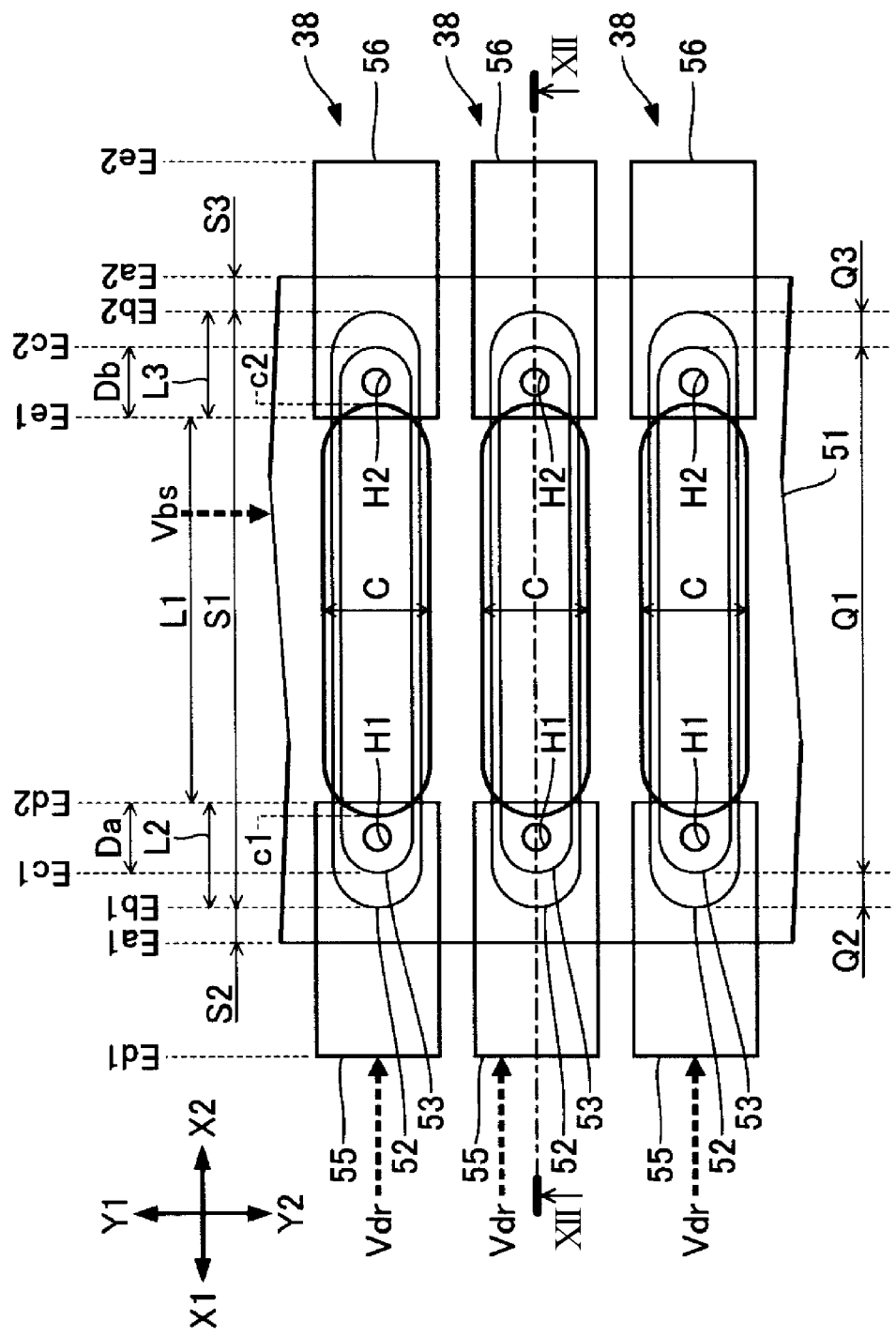
FIG. 11 is a plan view illustrating a plurality of piezoelectric devices of a second embodiment.
Figure 12:
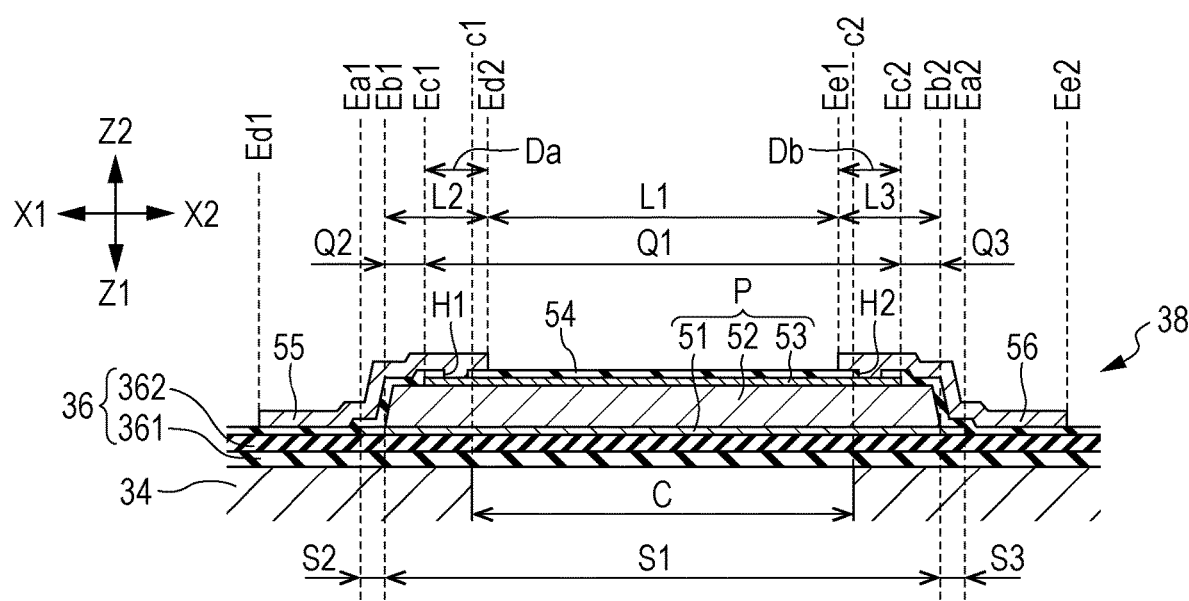
FIG. 12 is a sectional view taken along line XII-XII of FIG. 11.

FIG. 11 is a plan view illustrating a plurality of piezoelectric devices 38 of the second embodiment, and FIG. 12 is a sectional view taken long line XII-XII of FIG. 11. As illustrated in FIGS. 11 and 12, in the second embodiment, the locations of an end c1 and an end c2 of a pressure chamber C are different from those in the first embodiment.

As illustrated in FIGS. 11 and 12, a second laminate region L2 includes a second region Q2 and a laminate region Da. The laminate region Da is a region (region except for the second region Q2) in which a first electrode 51, a piezoelectric layer 52, a second electrode 53, an insulating layer 54, and a first wire 55 are stacked. That is, in the second region Q2, the second electrode 53 is not formed, whereas in the laminate region Da, the second electrode 53 is formed.

In the second embodiment, as illustrated in FIGS. 11 and 12, the end c1 overlaps the laminate region Da of the second laminate region L2 in plan view. In the above configuration, the strength of a diaphragm 36 in the vicinity of the end c1 is enhanced by the second electrode 53. Thus, the effect that the occurrence of cracks in the diaphragm 36 in the vicinity of the end c1 of the pressure chamber C can be reduced is significant.

As illustrated in FIGS. 11 and 12, a third laminate region L3 includes a third region Q3 and a laminate region Db. The laminate region Db is a region (region except for the third region Q3) in which the first electrode 51, the piezoelectric layer 52, the second electrode 53, the insulating layer 54, and the second wire 56 are stacked. That is, in the third region Q3, the second electrode 53 is not formed, whereas in the laminate region Db, the second electrode 53 is formed.

In the second embodiment, as illustrated in FIGS. 11 and 12, the end c2 overlaps the laminate region Db of the third laminate region L3 in plan view. In the above configuration, the strength of the diaphragm 36 in the vicinity of the end c2 is enhanced by the second electrode 53. Thus, the effect that the occurrence of cracks in the diaphragm 36 in the vicinity of the end c2 of the pressure chamber C can be reduced is significant.

Third Embodiment

Figure 13:
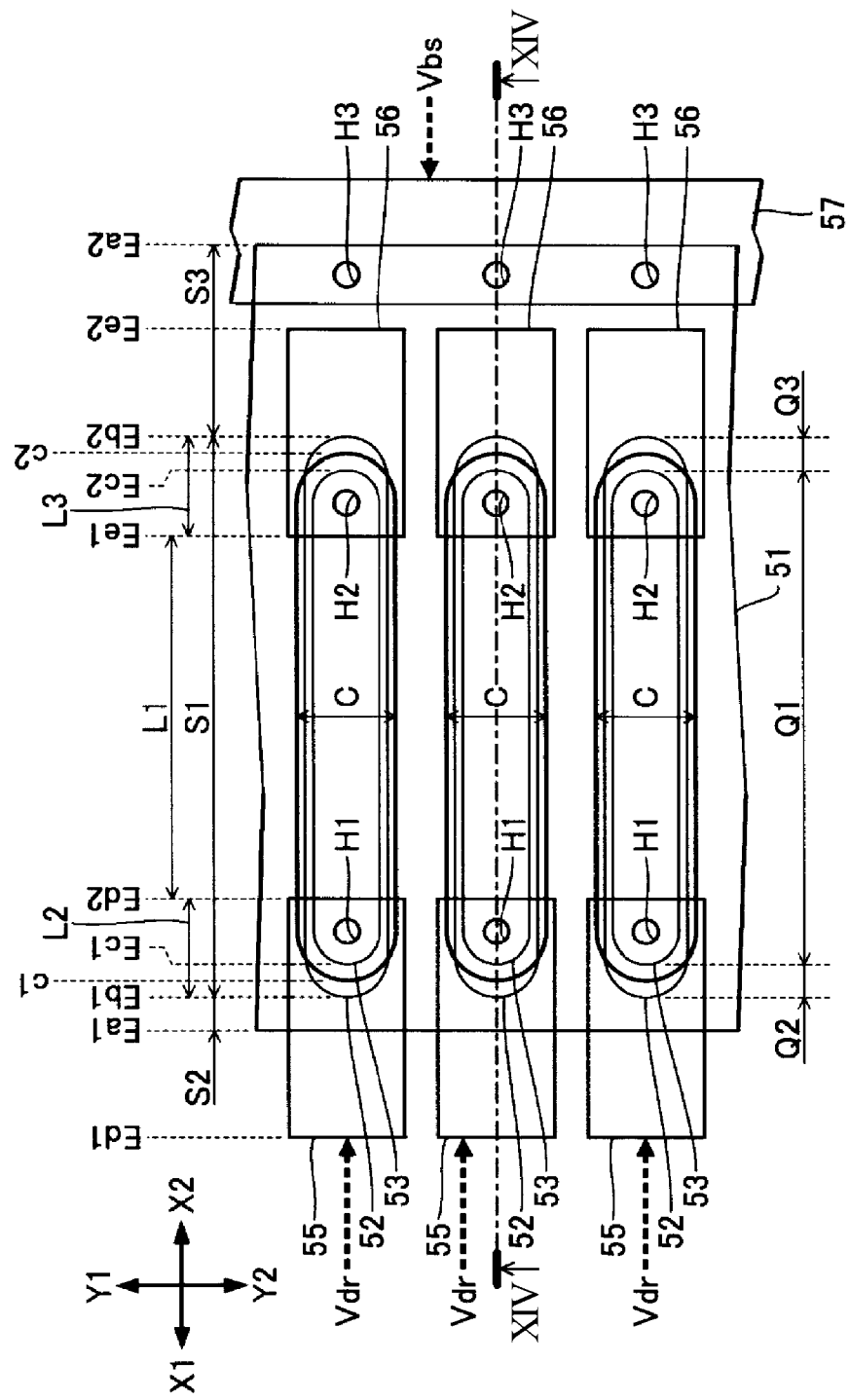
FIG. 13 is a plan view illustrating a plurality of piezoelectric devices of a third embodiment.
Figure 14:
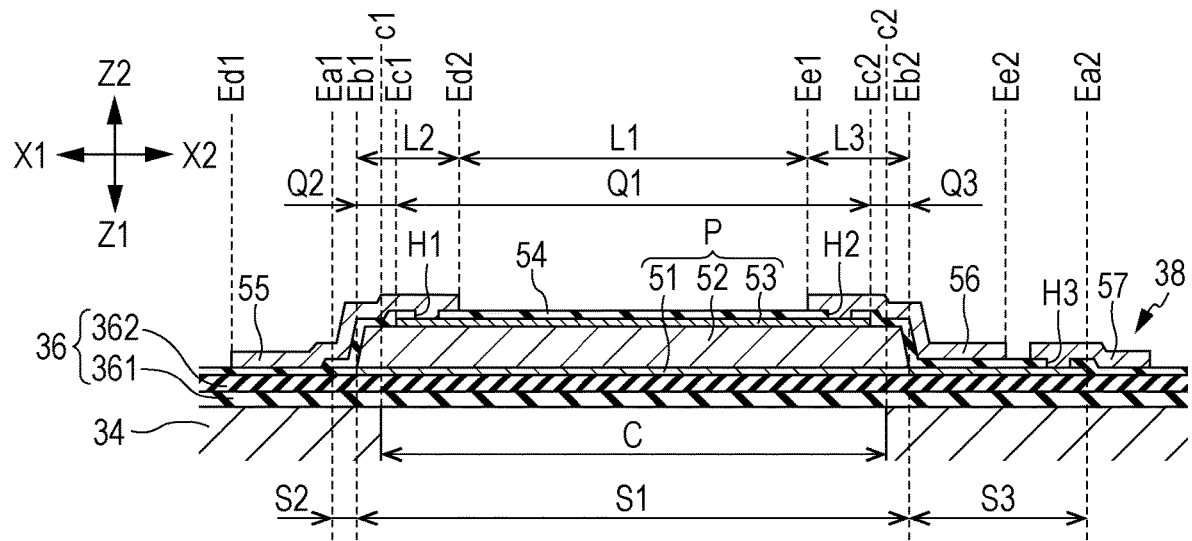
FIG. 14 is a sectional view taken along line XIV-XIV of FIG. 13.

FIG. 13 is a plan view illustrating a plurality of piezoelectric devices 38 of a third embodiment, and FIG. 14 is a sectional view taken long line XIV-XIV of FIG. 13. As illustrated in FIGS. 13 and 14, each piezoelectric device 38 of the third embodiment has a third portion S3 of a first electrode 51. The third portion S3 in the X direction is longer than that in the first embodiment. Each piezoelectric device 38 includes a third wire 57 in addition to elements similar to those in the first embodiment. The third wire 57 in the third embodiment is a belt-like electrode extending in the Y direction continuously over the plurality of piezoelectric devices 38. The third wire 57 is made of a conductive material which is lower in resistivity than the first electrode 51. For example, a common conductive layer is selectively removed, thereby collectively forming first wires 55, second wires 56, and the third wire 57.

As illustrated in FIGS. 13 and 14, the third wire 57 overlaps a portion of the first electrode 51 adjacent to an end Ea2 of in plan view. Thus, the third wire 57 is formed on a side of the second wire 56 opposite to the first wire 55 in plan view. The third wire 57 establishes electric conduction with the first electrodes 51 via contact holes H3 formed in an insulating layer 54. As illustrated in FIG. 13, the contact holes H3 are individually formed for, for example, the respective piezoelectric devices 38. Note that the shape and the location of the contact holes H3 are not limited. For example, a contact hole H3 which is continuous over the plurality of piezoelectric device 38 and which is long in the X direction may be formed. A prescribed reference voltage Vbs is applied from, for example, a wiring substrate 50 to the third wire 57. The reference voltage Vbs is applied to the first electrode 51 via the third wire 57.

Also in the third embodiment, the same effect as that in the first embodiment is realized. Moreover, the third embodiment enables a voltage to be applied to the first electrode 51 via the third wire 57. From a viewpoint of sufficiently securing a deformation amount of the piezoelectric layer 52, it is important to sufficiently reduce the thickness of the first electrode 51. However, the resistance of the first electrode 51 increases as the thickness of the first electrode 51 decreases. Thus, a voltage drop along the Y direction of the first electrode 51 occurs in a voltage applied from a wiring substrate 50 to the first electrode 51. Due to the voltage drop described above, a voltage error may occur in the voltage to be applied to a piezoelectric element P of each piezoelectric device 38. In the third embodiment, the third wire 57 is made of a conductive material which is lower in resistivity than the first electrode 51. Thus, the voltage drop in the first electrode 51 is suppressed, and consequently, the voltage error to be applied to each piezoelectric element P can be reduced.

Note that FIGS. 13 and 14 show a configuration in which an end c1 of a pressure chamber C is located in a second region Q2 and an end c2 of the pressure chamber C is located in a third region Q3 similarly to the first embodiment. However, in a configuration in which the third wire 57 is formed as in the third embodiment, a configuration in which the end c1 of the pressure chamber C is located in the laminate region Da as in the second embodiment or a configuration in which the end c2 of the pressure chamber C is located in the laminate region Db may be adopted.

Variations

Each embodiment described above may be modified in various ways. Specific modification aspects which can be adopted for each embodiment described above will be described below. Note that two or more aspects arbitrarily selected from the following examples may accordingly be adopted together as long as they do not contradict each other.

Figure 15:
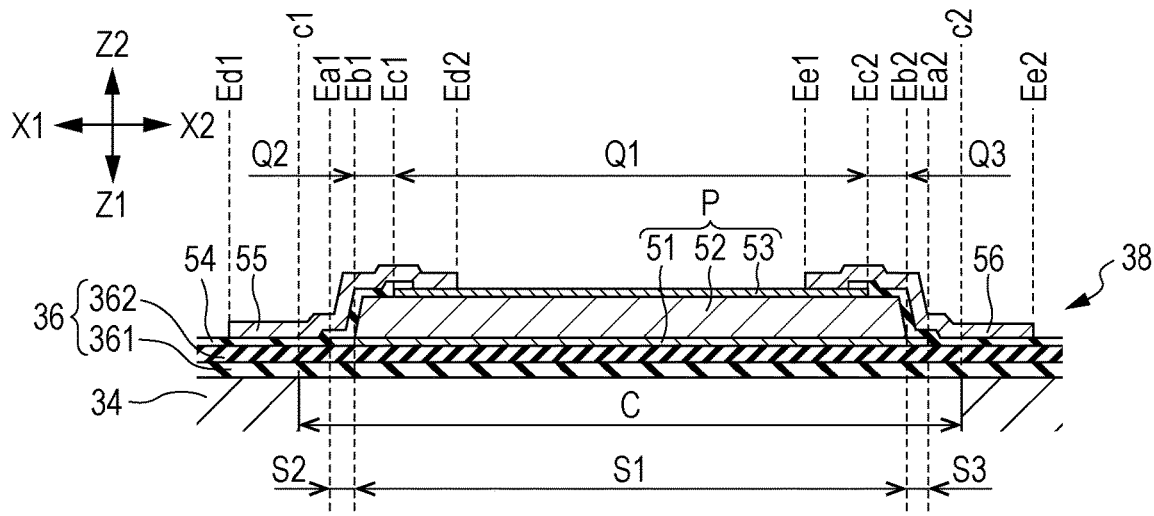
FIG. 15 is a sectional view illustrating a piezoelectric device according to a comparative example.

Each of the above embodiments has described the configuration in which the insulating layer 54 covers the entirety of each piezoelectric layer 52, but the region in which the insulating layer 54 is formed is not limited to the example described above. For example, as illustrated in FIG. 15, a configuration in which the insulating layer 54 is not formed in part or the entirety of the surface of the second electrode 53 may be adopted. A part included in each of the first wire 55 and the second wire 56 and protruding from the rim of the insulating layer 54 establishes electric conduction with the second electrode 53. As can be seen from the example shown in FIG. 15, the contact hole H1 and the contact hole H2 may be omitted. Moreover, in the third embodiment, a part included in the third wire 57 and protruding from the rim of the insulating layer 54 may be in contact with the first electrode 51. That is, the contact hole H3 may be omitted.

Each of the above embodiments has described the belt-like first electrode 51 continuous over the plurality of piezoelectric devices 38, but the shape of the first electrode 51 in plan view is not limited to the example described above. For example, the first electrode 51 may be individually formed for each piezoelectric device 38. In the configuration in which the first electrode 51 is formed as an individual electrode, a piezoelectric layer 52 is formed in a region in which the first electrode 51 is formed.

Figure 16:
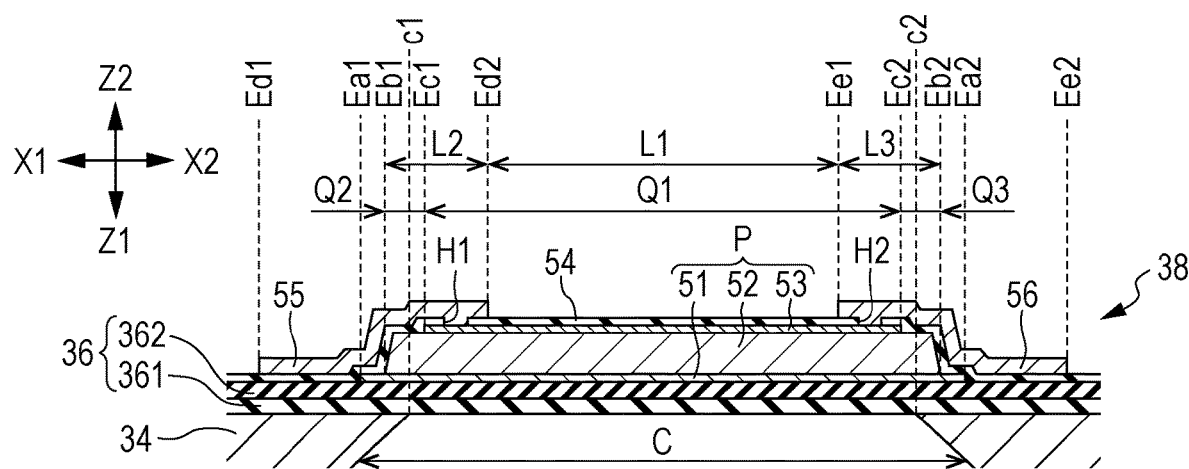
FIG. 16 is a sectional view illustrating a piezoelectric device according to a comparative example.

Each of the above embodiments has described a configuration in which the wall surface of the pressure chamber C is perpendicular to the diaphragm 36. However, as illustrated in FIG. 16, a configuration in which a wall surface of a pressure chamber C is inclined toward a surface (X-Y plane) of a diaphragm 36 may be adopted. In the configuration of FIG. 16, an end c1 of the pressure chamber C is a portion in which the wall surface (inclined surface) of the pressure chamber C on the X1 side in the X direction and the surface of the diaphragm 36 intersect with each other. Similarly, an end c2 of the pressure chamber C is a portion in which the wall surface (inclined surface) of the pressure chamber C on the X2 side in the X direction and the surface of the diaphragm 36 intersect with each other. A positional relationship in plan view between the piezoelectric device 38 and the pressure chamber C is determined such that the end c1 or the end c2 described above satisfies the conditions illustrated in each embodiment described above.

In each of the above embodiments, the second electrode 53 and the first wire 55 are separately formed. However, the second electrode 53 and the first wire 55 may be integrally formed from a common conductive layer (single layer or a plurality of layers).

The locations of the end c1 and the end c2 of the pressure chamber C are not limited to the examples according to the embodiments described above. For example, the end c1 of the pressure chamber C may be located at an arbitrary position in an area between the end Ea1 of the first electrode 51 and the end Ed2 of the first wire 55. Similarly, for example, the end c2 of the pressure chamber C may be located at an arbitrary position in an area between the end Ea2 of the first electrode 51 and the end Ee1 of the second wire 56.

The shape of the pressure chamber C or the piezoelectric device 38 in plan view is not limited to the example of each embodiment described above. For example, in a configuration in which a monocrystalline substrate of silicon (S1) is adopted as the pressure chamber substrate 34, a crystal surface is actually reflected by the shape of the pressure chamber C in plan view.

Each of the above embodiments has described the liquid ejecting apparatus 100 of a serial system in which the transport body 242 provided with the liquid ejection head 26 is reciprocated. However, the invention is applicable to a liquid ejecting apparatus of a line system in which a plurality of nozzles N are distributed in the entire width of the medium 12.

The liquid ejecting apparatus 100 illustrated in each embodiment described above may be adopted for apparatuses specifically used for performing printing and various apparatuses such as facsimile devices and a copiers. Note that the application of the liquid ejecting apparatus of the invention is not limited to the printing. For example, a liquid ejecting apparatus configured to eject a solution of a color material is used as a fabrication apparatus for forming a color filter of a liquid crystal display device. Moreover, a liquid ejecting apparatus configured to eject a solution of a conductive material is used as a fabrication apparatus for forming a trace or an electrode of a wiring substrate.

What is claimed is:

1. A liquid ejection head comprising:
  a pressure chamber in which liquid is stored; and
  a piezoelectric device configured to cause the liquid to be ejected from the pressure chamber, wherein
  the piezoelectric device includes
    a first electrode,
    a piezoelectric layer,
    a second electrode,
    an insulating layer,
    a first wire electrically connected to the second electrode, and
    a second wire electrically connected to the second electrode, and the piezoelectric device has
    a first region in which the first electrode, the piezoelectric layer, and the second electrode are disposed in this order,
    a second region which is located on a side adjacent to a first end of the piezoelectric layer and in which the first electrode, the piezoelectric layer, the insulating layer, and the first wire are disposed in this order, and
    a third region which is located on a side adjacent to a second end of the piezoelectric layer opposite to the first end and in which the first electrode, the piezoelectric layer, the insulating layer, and the second wire are disposed in this order,
  wherein the second electrode is not disposed within the second or third region, and
  wherein the first electrode extends across the first, second, and third regions.

2. The liquid ejection head according to claim 1, wherein the first electrode includes
  a first portion in which the piezoelectric layer is disposed and
  a second portion different from the first portion, and
  the first wire establishes electric conduction with the second electrode on a surface of the piezoelectric layer and overlaps the second portion of the first electrode with the insulating layer disposed between the first wire and the second portion.

3. The liquid ejection head according to claim 2, wherein the first electrode includes a third portion located on a side of the first portion opposite to the second portion, and
  the second wire establishes electric conduction with the second electrode on the surface of the piezoelectric layer and overlaps the third portion of the first electrode with the insulating layer disposed between the second wire and the third portion.

4. The liquid ejection head according to claim 1, wherein
the first wire establishes electric conduction with the second electrode on the surface of the piezoelectric layer via a first contact hole formed in the insulating layer, and
the second wire establishes electric conduction with the second electrode on the surface of the piezoelectric layer via a second contact hole formed in the insulating layer.

5. The liquid ejection head according to claim 1 further comprising:
a third wire which is disposed on a side of the second wire opposite to the first wire in plan view and which establishes electric conduction with the first electrode.

6. The liquid ejection head according to claim 1, wherein
the first wire is supplied with a drive signal from an external circuit, and
the second wire is electrically connected to the external circuit via the second electrode and the first wire.

7. The liquid ejection head according to claim 1 further comprising:
a diaphragm constituting a wall surface of the pressure chamber, wherein
the liquid ejection head has
a first laminate region in which the first electrode, the piezoelectric layer, and the second electrode are disposed in this order, and
a second laminate region which is located on a side adjacent to the first end of the piezoelectric layer and in which the first electrode, the piezoelectric layer, the insulating layer, and the first wire are disposed in this order, and
the pressure chamber has a first end at which the wall surface of the pressure chamber adjacent to the first end of the piezoelectric layer and the diaphragm intersect with each other, and the first end overlaps the second laminate region in plan view.

8. The liquid ejection head according to claim 7, wherein
the second electrode is disposed on the surface of the piezoelectric layer,
the first wire is disposed on a surface of the insulating layer and establishes electric conduction with the second electrode on the surface of the piezoelectric layer,
the first end of the pressure chamber overlaps a region of the second laminate region in plan view, the region including the first electrode, the piezoelectric layer, the second electrode, the insulating layer, and the first wire which are disposed in this order.

9. The liquid ejection head according to claim 7, wherein
the piezoelectric device includes the second wire electrically connected to the second electrode, and
the piezoelectric device has a third laminate region which is located on a side adjacent to the second end of the piezoelectric layer opposite to the first end and in which the first electrode, the piezoelectric layer, the insulating layer, and the second wire are disposed in this order.

10. The liquid ejection head according to claim 9, wherein
the pressure chamber has a second end at which a wall surface of the pressure chamber adjacent to the second end of the piezoelectric layer and the diaphragm intersect with each other, and the second end of the pressure chamber overlaps the third laminate region in plan view.

11. The liquid ejection head according to claim 9, wherein
the second end of the pressure chamber overlaps a region of the third laminate region in plan view, the region including the first electrode, the piezoelectric layer, the second electrode, the insulating layer, and the second wire which are disposed in this order.

12. A liquid ejecting apparatus comprising:
the liquid ejection head according to claim 1.

13. A liquid ejecting apparatus comprising:
the liquid ejection head according to claim 2.

14. A liquid ejecting apparatus comprising:
the liquid ejection head according to claim 3.

15. A liquid ejecting apparatus comprising:
the liquid ejection head according to claim 4.

16. A liquid ejecting apparatus comprising:
the liquid ejection head according to claim 5.

17. A piezoelectric device comprising:
a first electrode;
a piezoelectric layer;
a second electrode;
an insulating layer;
a first wire electrically connected to the second electrode; and
a second wire electrically connected to the second electrode, wherein
the piezoelectric device has
a first region in which the first electrode, the piezoelectric layer, and the second electrode are disposed in this order,
a second region which is located on a side adjacent to a first end of the piezoelectric layer and in which the first electrode, the piezoelectric layer, the insulating layer, and the first wire are disposed in this order, and
a third region which is located on a side adjacent to a second end of the piezoelectric layer opposite to the first end and in which the first electrode, the piezoelectric layer, the insulating layer, and the second wire are disposed in this order,
wherein the second electrode is not disposed within the second or third region, and
wherein the first electrode extends across the first, second, and third regions.

18. The liquid ejection head according to claim 1,
wherein the first electrode, the piezoelectric layer, and the second electrode are disposed in a disposing direction,
wherein the first end of the piezoelectric layer overlaps the first wire when viewing from the disposing direction, and
wherein the second end of the piezoelectric layer overlaps the second wire when viewing from the disposing direction.

* * * * *